United States Patent
Hung

(10) Patent No.: US 10,285,273 B1
(45) Date of Patent: May 7, 2019

(54) DUMMY MEMORY BOARD

(71) Applicant: V-COLOR TECHNOLOGY INC., New Taipei (TW)

(72) Inventor: Con-Ning Hung, New Taipei (TW)

(73) Assignee: V-COLOR TECHNOLOGY INC., New Taipei (TW)

( * ) Notice: Subject to any disclaimer, the term of this patent is extended or adjusted under 35 U.S.C. 154(b) by 0 days.

(21) Appl. No.: 15/952,922

(22) Filed: Apr. 13, 2018

(30) Foreign Application Priority Data

Mar. 20, 2018 (TW) .............................. 107203582 U

(51) Int. Cl.
  *H05K 1/11* (2006.01)
  *H05K 1/18* (2006.01)
  *H01R 12/73* (2011.01)

(52) U.S. Cl.
  CPC ............. *H05K 1/181* (2013.01); *H05K 1/117* (2013.01); *H01R 12/737* (2013.01); *H05K 2201/10106* (2013.01); *H05K 2201/10159* (2013.01); *H05K 2201/10522* (2013.01); *H05K 2201/10545* (2013.01)

(58) Field of Classification Search
  CPC .................... H05K 1/181; H05K 1/117; H05K 2201/10106; H05K 2201/10159; H05K 2201/10522; H05K 2201/10545; H01R 12/737
  See application file for complete search history.

(56) References Cited

U.S. PATENT DOCUMENTS

| | | | | |
|---|---|---|---|---|
| 6,346,886 B1 * | 2/2002 | De La Huerga | ........ | A61J 1/035 340/573.1 |
| 2001/0022739 A1 * | 9/2001 | Funaba | .................... | G11C 5/04 365/63 |
| 2001/0024389 A1 * | 9/2001 | Funaba | .................... | G11C 5/04 365/200 |
| 2002/0022405 A1 * | 2/2002 | Jung | ........................ | G11C 5/04 439/625 |
| 2009/0045512 A1 * | 2/2009 | Hedler | .................. | H01L 21/486 257/738 |
| 2010/0081237 A1 * | 4/2010 | Wong | .................... | H01L 21/565 438/127 |

OTHER PUBLICATIONS

CN-203102676-U, Jul. 2013, Dong Yu (Year: 2013).*

* cited by examiner

*Primary Examiner* — Mary Ellen Bowman
(74) *Attorney, Agent, or Firm* — Muncy, Geissler, Olds & Lowe, P.C.

(57) ABSTRACT

A dummy memory board includes a substrate, a connecting finger, a plurality of light emitting diodes, and an electrical circuit. The substrate has a front surface and a back surface, and is provided with at least one dummy memory region. The connecting finger is close to a lower edge of the substrate for inserting into a memory slot. The light emitting diodes are on the substrate and close to the upper edge of the front surface and the back surface. The electrical circuit is on the substrate for connecting the light emitting diodes to the connecting finger. Thus, power from the memory slot is transferred to the light emitting diodes through the connecting finger, and the light emitting diodes are turned on to demonstrate the desired light effect. Particularly, the electrical circuit has no suspending node or open spot and interference due to antenna effect is avoided.

7 Claims, 1 Drawing Sheet

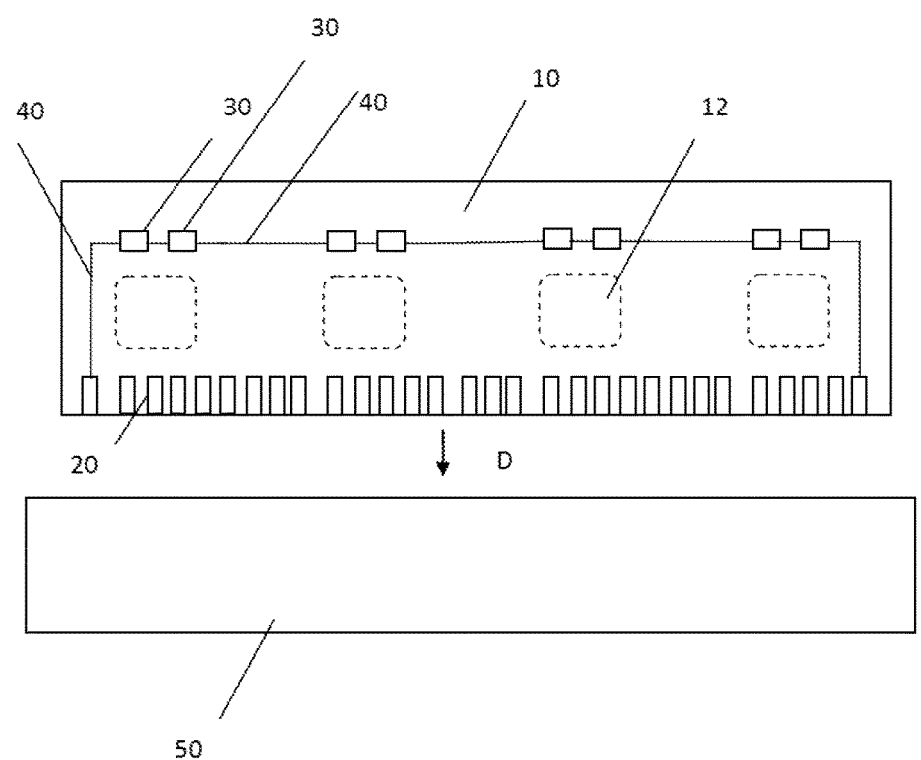

DUMMY MEMORY BOARD

CROSS-REFERENCE TO RELATED APPLICATION

This application claims the priority of Taiwanese patent application No. 107203582, filed on Mar. 20, 2018, which is incorporated herewith by reference.

BACKGROUND OF THE INVENTION

1. Field of the Invention

The present invention generally relates to a dummy memory board, and more specifically to a dummy memory board employing an electrical circuit to connect light emitting diodes to a connecting finger to demonstrate light effect without inducing interference due to antenna effect because of no suspending node or open spot in the electrical circuit.

2. The Prior Arts

In general, a host computer or high performance server needs a plurality of memory slots like 4 memory slots for inserting memory boards of modules. When the host computer or server operates, a great deal of temporary data or information are generated and temporarily stored in the memory chips of the memory module for subsequent access or process, and the temporary data or information are removed from the memory after the host computer or server finishes the operation. The memory module uses the connection finger to contact the electrical connection of the memory slot so as to convey electrical signal and obtain power for operation. Therefore, the user can easily expand the memory volume of the whole system for optimal performance by inserting the additional memory modules into the empty memory slots.

Recently, related manufacturers have developed a specific memory module with light effect to enhance sense of vision. For instance, light emitting diodes (LEDs) are provided on the memory module and turned on after power on. The LEDs greatly help the user identifying and replacing the damaged or out-of-phase memory module by a new advanced one. However, the memory slot without inserting the memory module is empty, and no light effect is provided, resulting in a dark region. If a dummy memory module is formed by just removing the memory chips without modifying the electrical circuit, and inserted into the memory slot, the same light effect is achieved, but the original locations designed for the memory chips leave suspending nodes or open spots on the electrical circuit. It is obvious that antenna effect and interference are induced to affect signal stability for peripheral electrical elements and devices, particularly for high frequency operation.

Therefore, it is greatly needed to provide a new dummy memory board employing an electrical circuit to connect light emitting diodes to a connecting finger to demonstrate light effect without induction of any interference effect due to antenna because of no suspending node or open spot in the electrical circuit, thereby overcoming the above problems in the prior arts.

SUMMARY OF THE INVENTION

The primary objective of the present invention is to provide a dummy memory board for inserting into a memory slot of an external device, comprising a substrate, a connecting finger, a plurality of light emitting diodes, and an electrical circuit. The substrate with a shape of a plate has a front surface and a back surface, and at least one of the front surface and the back surface is provided with at least one dummy memory region. The connecting finger is formed of an electrically conductive material and provided on the substrate and close to a lower edge of the front surface and the back surface for inserting into the memory slot for physical contact and electrical connection. The light emitting diodes are on the front surface and the back surface and particularly close to the upper edge of the front surface and the back surface. The electrical circuit is provided on the substrate for connecting the light emitting diodes to the connecting finger. Thus, power from the memory slot is transferred to the light emitting diodes through the connecting finger, and the light emitting diodes are turned on to demonstrate the desired light effect.

Specifically, the dummy memory region is placed between the connecting finger and the light emitting diodes, and the electrical circuit can directly pass through or bypass the dummy memory region. In other words, the electrical circuit is only intended to connect the light emitting diodes and the connecting finger, and does not comprise any suspending node or open spot such that no effect due to antenna interference is induced.

BRIEF DESCRIPTION OF THE DRAWINGS

The present invention can be understood in more detail by reading the subsequent detailed description in conjunction with the examples and references made to the accompanying drawings, wherein:

FIGURE is a view showing a dummy memory board according to the embodiment of the present invention.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Please refer to FIGURE illustrating the dummy memory board according to the embodiment of the present invention. As shown in FIGURE, the dummy memory board of the present invention comprises a substrate 10, a connecting finger 20, a plurality of light emitting diodes (LEDs) 30, and an electrical circuit 40 for inserting into a memory slot 50 of an external device (not shown) like moving along an inserting direction D. In general, the external device is a host computer or a server, and has the memory slots 50 such as four memory slots 50. However, only one memory slot 50 is occupied, and each of the other empty memory slots 50 is intended for the dummy memory board of the present invention to insert into.

Specifically, the substrate 10 has a shape of a plate, and substantially comprises a front surface and a back surface. It should be noted that only the front surface is shown for reference. At least one of the front surface and the back surface is provided with at least one dummy memory region 12, which is empty and without any electrical or electronic element placed. The connecting finger 20 is formed of an electrically conductive material like copper and provided on the substrate 10, particularly close to the lower edge of the front surface and the back surface for inserting into the memory slot 50 of the external device.

The light emitting diodes 30 are provided on the front surface and the back surface, and close to the upper edge of the front surface and the back surface. The electrical circuit 40 is provided on the substrate 10 for electrically connecting the light emitting diodes 30 to the connecting finger 20. The light emitting diodes 30 are turned on by power from the memory slot 50 through the connecting finger 20 such that the dummy memory board of the present invention demonstrates the desired light effect.

Additionally, the dummy memory region 12 is between the connecting finger 20 and the light emitting diodes 30, and the electrical circuit 40 can directly pass through or bypass the dummy memory region 12. It should be noted that FIGURE shows one illustrative example and the electrical circuit 40 bypasses the dummy memory region 12. Overall, the electrical circuit 40 is only intended to connect the light emitting diodes 30 and the connecting finger 20, and does not comprise any suspending node or open spot such that no effect due to antenna interference is induced.

Then, the front surface and the back surface of the substrate 10 is further covered with a solder mask (not shown) such as solder resist to provide isolation and protection for the electrical circuit 40. The solder mask does not cover the connecting finger 20 and the light emitting diodes 30 such that the surface property of the connecting finger 20 is not affected and the optical feature of the light emitting diodes 30 is maintained.

The above light emitting diodes 30 can be connected in series or in parallel through the electrical circuit 40 to meet the actual requirement. For example, if the memory slot provides power with sufficient voltage, the light emitting diodes 30 are preferably connected in series, and driven by the same current such that each light emitting diode 30 emits light with almost the same brightness. However, when any one light emitting diode 30 is failure, the others are affected. If the electrical circuit 40 connects the light emitting diodes 30 in parallel, the interference caused by the light emitting diode 30 in failure is avoided, thereby improving operation reliability. It should be noted that all the light emitting diodes 30 are connected in series in FIGURE to clearly describe the feature of the present invent, and not intended to limit the scope of the present invention.

Furthermore, the light emitting diodes 30 are arranged to form a straight line, a curve, a word, a symbol, or a pattern, like a logo or trademark of the manufacturer.

From the above-mentioned, one aspect of the present invention is that the dummy memory board can be inserted into any empty memory slot to provide preset light effect. Particularly, the electrical circuit does not comprise any suspending node or open spot such that no effect due to antenna interference is induced such that the external device operates with high stability and reliability. In addition, the dummy memory board is specifically designed with the same shape and size as the traditional memory board, and comprises the same connecting finger. That is, the dummy memory board and the traditional memory board inserted into the memory slots are the same in vision and demonstrate the desired light effect.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A dummy memory board, comprising:
    a substrate with a shape of a plate, comprising a front surface and a back surface, at least one of the front surface and the back surface provided with at least one dummy memory region;
    a connecting finger formed of an electrically conductive material and provided on the front surface and the back surface for inserting into a memory slot of an external device;
    a plurality of light emitting diodes provided on the front surface and the back surface; and
    an electrical circuit provided on the substrate for electrically connecting the light emitting diodes to the connecting finger,
    wherein the connecting finger is close to a lower edge of the front surface and the back surface, the light emitting diodes are close to an upper edge of the front surface and the back surface, the dummy memory region is between the connecting finger and the light emitting diodes, and the light emitting diodes are turned on by power from the memory slot through the connecting finger.

2. The dummy memory board as claimed in claim 1, wherein the front surface and the back surface are covered with a solder mask, and the solder mask does not cover the connecting finger and the light emitting diodes.

3. The dummy memory board as claimed in claim 2, wherein the solder mask is solder resist.

4. The dummy memory board as claimed in claim 1, wherein the light emitting diodes are connected in series through the electrical circuit.

5. The dummy memory board as claimed in claim 1, wherein the light emitting diodes are connected in parallel through the electrical circuit.

6. The dummy memory board as claimed in claim 1, wherein the light emitting diodes are arranged to form a straight line, a curve, a word, a symbol, or a pattern.

7. The dummy memory board as claimed in claim 1, wherein the external device is a host computer or a server.

* * * * *